(12) United States Patent
Ashjaee et al.

(10) Patent No.: US 6,953,392 B2
(45) Date of Patent: Oct. 11, 2005

(54) INTEGRATED SYSTEM FOR PROCESSING SEMICONDUCTOR WAFERS

(75) Inventors: Jalal Ashjaee, Cupertino, CA (US); Homayoun Talieh, San Jose, CA (US)

(73) Assignee: ASM Nutool, Inc., Fremont, CA (US)

( * ) Notice: Subject to any disclaimer, the term of this patent is extended or adjusted under 35 U.S.C. 154(b) by 443 days.

(21) Appl. No.: 09/795,687

(22) Filed: Feb. 27, 2001

(65) Prior Publication Data

US 2002/0088543 A1 Jul. 11, 2002

Related U.S. Application Data

(60) Provisional application No. 60/259,676, filed on Jan. 5, 2001, and provisional application No. 60/261,263, filed on Jan. 16, 2001.

(51) Int. Cl.[7] .............................................. B24B 7/22
(52) U.S. Cl. ........................ 451/67; 451/288; 451/339
(58) Field of Search ...................... 156/345.12; 204/198, 204/241, 269, 270; 216/38, 88–90, 108, 109; 438/690–693; 451/287, 288, 290, 36, 37, 41, 54, 57, 59, 63, 65, 66, 67, 331, 339

(56) References Cited

U.S. PATENT DOCUMENTS

| 5,826,129 | A | | 10/1998 | Hasebe et al. ............... 396/611 |
|---|---|---|---|---|
| 5,830,045 | A | * | 11/1998 | Togawa et al. .............. 451/288 |
| 5,885,138 | A | | 3/1999 | Okumura et al. .............. 451/67 |
| 5,972,110 | A | | 10/1999 | Akimoto ....................... 118/52 |
| 6,110,011 | A | | 8/2000 | Somekh et al. ................ 451/28 |
| 6,136,163 | A | | 10/2000 | Cheung et al. ............. 204/198 |
| 6,258,223 | B1 | * | 7/2001 | Cheung et al. ............. 204/242 |
| 6,494,985 | B1 | * | 12/2002 | Sotozaki et al. ....... 156/345.12 |
| 6,613,200 | B2 | * | 9/2003 | Li et al. ..................... 204/198 |

FOREIGN PATENT DOCUMENTS

| EP | 0 978 867 | 2/2000 |
|---|---|---|
| EP | 1 037 263 | 9/2000 |

\* cited by examiner

*Primary Examiner*—Timothy V. Eley
(74) *Attorney, Agent, or Firm*—Knobbe Martens Olson & Bear LLP

(57) ABSTRACT

An integrated system for processing a plurality of wafers, having a conductive front surface, is provided. The system includes a plurality of processing subsystems for depositing on or removing metal from the front surfaces of the wafers. Each processing subsystem includes a process chamber and a cleaning chamber. The system also has a wafer handling subsystem for transporting each of the wafers into or out of the appropriate one of the plurality of processing subsystems. The plurality of processing subsystems and wafer handling subsystem form an integrated system.

40 Claims, 4 Drawing Sheets

INTEGRATED SYSTEM FOR PROCESSING SEMICONDUCTOR WAFERS

CROSS-REFERENCE TO RELATED APPLICATIONS

This invention claims priority based on U.S. Provisional Application Nos. 60/259,676 filed Jan. 5, 2001 and 60/261,263 filed Jan. 16, 2001.

BACKGROUND OF THE INVENTION

1. Field of the Invention

The present invention generally relates to semiconductor processing technologies and, more particularly, to an integrated semiconductor wafer processing system.

2. Description of the Related Art

In the semiconductor industry, various processes can be used to deposit and etch materials on the wafers. Deposition techniques include processes such as electrochemical deposition (ECD) and electrochemical mechanical deposition (ECMD). In both processes, a conductor is deposited on a semiconductor wafer or a work piece by having electrical current carried through an electrolyte that comes into contact with the surface of the wafer (cathode). The ECMD process is able to uniformly fill the holes and trenches on the surface of the wafer with the conductive material while maintaining the planarity of the surface. A more detailed description of the ECMD method and apparatus can be found in U.S. Pat. No. 6,176,992, entitled "Method and Apparatus For Electrochemical Mechanical Deposition," commonly owned by the assignee of the present invention.

If a conventional plating process is performed to deposit the conductive material in a deposition chamber, the work piece may be transferred to another chamber in the cluster tool for polishing mechanically and chemically, e.g., chemical mechanical polishing (CMP). As is known, the material removal can also be carried out using electrochemical etching by making the wafer anodic (positive) with respect to an electrode after completing a ECD or ECMD process.

Regardless of which process is used, the work piece is next transferred to a rinsing/cleaning station after the deposition and/or polishing steps. During the rinsing/cleaning step, various residues generated by the deposition and/or polishing processes are rinsed off the wafer with a fluid such as water or the like, and subsequently wafer is dried.

Conventionally, processing chambers are designed in multiple processing stations or modules that are arranged in a cluster to form a cluster tool or system. Such cluster tools or systems are often used to process a multiple number of wafers at the same time. Generally, cluster tools are configured with multiple processing stations or modules and are designed for a specific operation. However in such conventional cluster tools, deposition and cleaning processing steps both typically require separate chambers. For this reason, in known cluster tools, for a wafer to be processed and cleaned, it must be moved to another station or system. Thus, such configured systems require picking wafers from a particular processing environment and placing into a cleaning environment. This may not be appropriate because during such transfer of the wafers, contaminants such as particles may attach themselves on the wafers. Additionally, such sequence of unloading, transporting, and reloading of the wafers may be costly and time consuming or require larger footprint.

To this end, there is a need for alternative integrated processing systems which reduce manufacturing cost and increase manufacturing efficiency.

SUMMARY OF THE INVENTION

An integrated system for processing a plurality of wafers, having a conductive front surface, is provided. The system includes a plurality of processing subsystems for depositing on or removing metal from the front surfaces of the wafers. Each processing subsystem includes a process chamber and a cleaning chamber. The system also has a wafer handling subsystem for transporting each of the wafers into or out of the appropriate one of the plurality of processing subsystems. The plurality of processing subsystems and wafer handling subsystem form an integrated system.

These and other features, aspects and advantages of the present invention will become better understood with reference to the following drawings, description and claims.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE INVENTION

The present invention provides a system for semiconductor device fabrication. The system comprises several process modules to perform process steps such as electrochemical mechanical deposition (ECMD), electrochemical deposition (ECD), chemical mechanical polishing (CMP) and electrochemical polishing (EC-polishing) integrated with other process steps such as cleaning, edge removal and drying. Additionally, an integrated tool of the present invention is designed to utilize these process modules to perform multiple processing steps related to electrochemical deposition, chemical mechanical polishing, and electrochemical polishing.

As mentioned above, following the ECD, ECMD, CMP or electrochemical polishing processes, the electrolyte residues need to be rinsed off the wafer, and subsequently wafer needs to be dried. Additionally, after such processes, it may be necessary to remove a portion of the metal that is deposited near the edge of the wafer surface. This process is often referred to as 'bevel edge clean' or 'edge removal' step. In the present invention, exemplary process chambers, i.e., ECD, ECMD, CMP or electrochemical polishing chambers, and their respective cleaning chambers are stacked vertically. In the prior art, however, the ECD process, electrochemical etching process, CMP process and cleaning process are carried at different chambers located horizontally with respect to each other. The edge removal step may be carried out in the cleaning chamber. In the context of this application, the cleaning chamber is the chamber where cleaning (using a fluid such as water or the like to remove residues therefrom) and drying and possibly edge removal process steps are performed.

Figure 1:
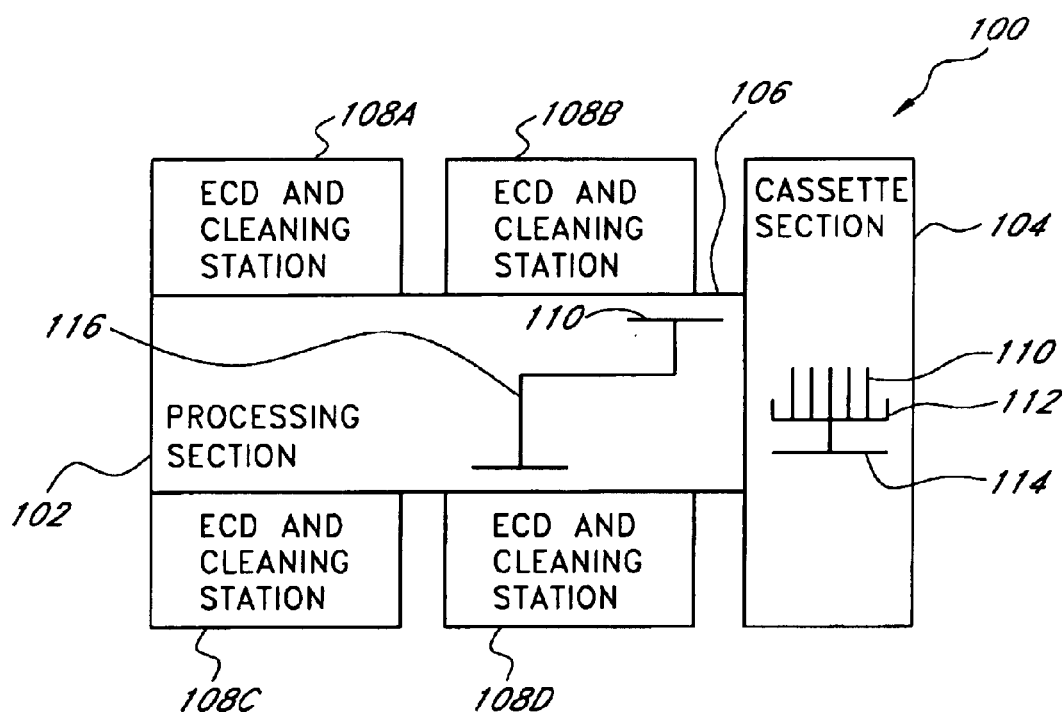
FIG. 1 illustrates a first embodiment of the present invention using a plurality of electrochemical deposition process stations.
Figure 2:
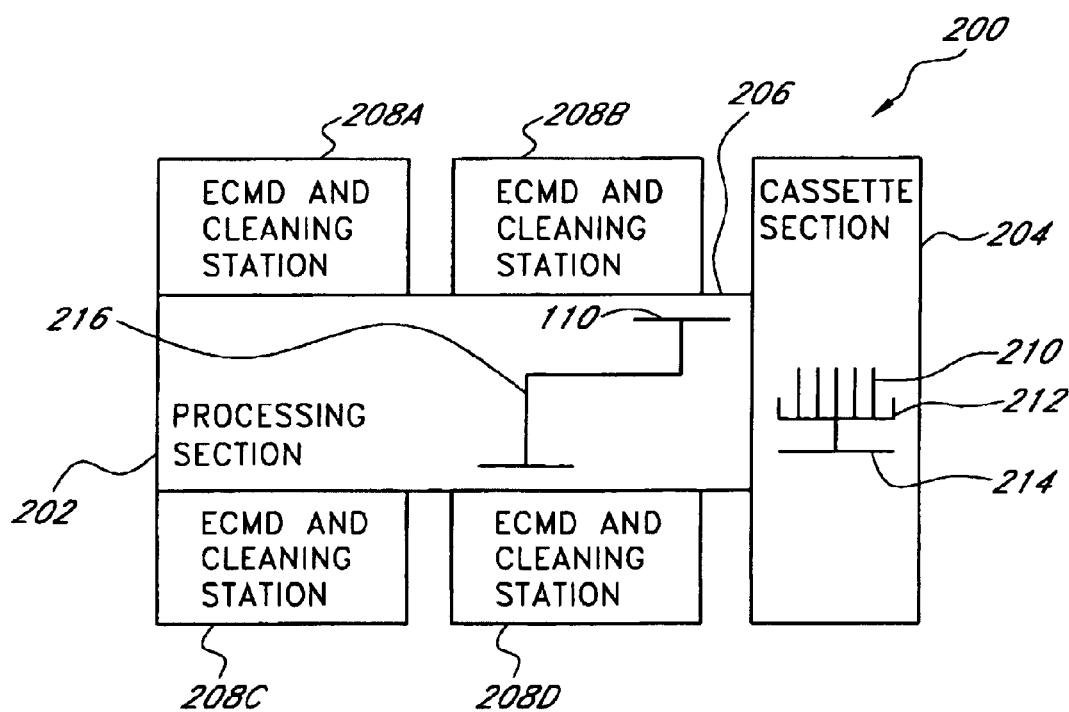
FIG. 2 illustrates a second embodiment of the present invention using a plurality of electro-chemical mechanical deposition process stations.

Reference will now be made to the drawings wherein like numerals refer to like parts throughout. FIG. 1 illustrates an integrated tool 100 or system of the present invention which comprises a processing section 102 and a load/unload section 104 or a cassette section connected to the processing section through a buffer section 106. The processing section may comprise one or more process stations 108A–108D that may be clustered around the processing station 102, as in the manner shown in FIG. 1. In this embodiment, the process stations 108A–108D may preferably be vertically stacked chambers which may have a electrochemical deposition (ECD) chamber and a cleaning chamber (i.e., ECD/cleaning chamber). If so configured, the integrated tool 100 of the present invention is able to process wafers with different diameters. In one example, the process stations 108A and 108B can process 300 mm wafers while the process stations 108C, 108D are processing 200 mm wafers or vice versa. As previously mentioned, one such exemplary vertical chamber design and operation is disclosed in the co-pending U.S. application Ser. No. 09/466,014, entitled "Vertically Configured Chamber Used for Multiple Processes," filed Dec. 17, 1999, commonly owned by the assignee of the present invention. In operation, wafers 110 or work pieces to be plated are delivered to the cassette section 104 in a cassette 112 and then each may be picked up and transferred to the buffer section 106 by a first robot 114. Each wafer 110 can then be transferred to one of the vertical chambers 108A–108D in the processing section 102 by a second robot 116. As mentioned above, the vertical chambers 108A–108D can be either adapted to process 200 or 300 millimeter wafers. After the electrochemical deposition and cleaning processes are complete, the above transport steps are performed in reverse order to remove each of the wafers from the integrated tool 100. FIG. 2 illustrates another embodiment of an integrated tool 200 or system of the present invention which comprises a processing section 202 and a load/unload section 204 or a cassette section connected to the processing section through a buffer section 206. The processing section may comprise one or more process stations 208A–208D which may be clustered around the processing section 202, as in the manner shown in FIG. 2. In this embodiment, the process stations 208A–208D may preferably be vertically stacked chambers which may have a electrochemical mechanical deposition (ECMD) chamber and a cleaning chamber (i.e., ECMD/cleaning chamber), which can perform either plating or removal of a conductive material on a workpiece, as described in U.S. Pat. No. 6,176,992 mentioned above. If so configured, the integrated tool 200 of the present invention is able to process wafers with different diameters. In one example, the process stations 108A and 108B can process 300 mm wafers while the process stations 108C, 108D are processing 200 mm wafers or vice versa. As previously mentioned, one such exemplary vertical chamber design and operation is disclosed in the co-pending U.S. application Ser. No. 09/466,014, entitled "Vertically Configured Chamber Used for Multiple Processes," filed Dec. 17, 1999, commonly owned by the assignee of the present invention.

Figure 3:
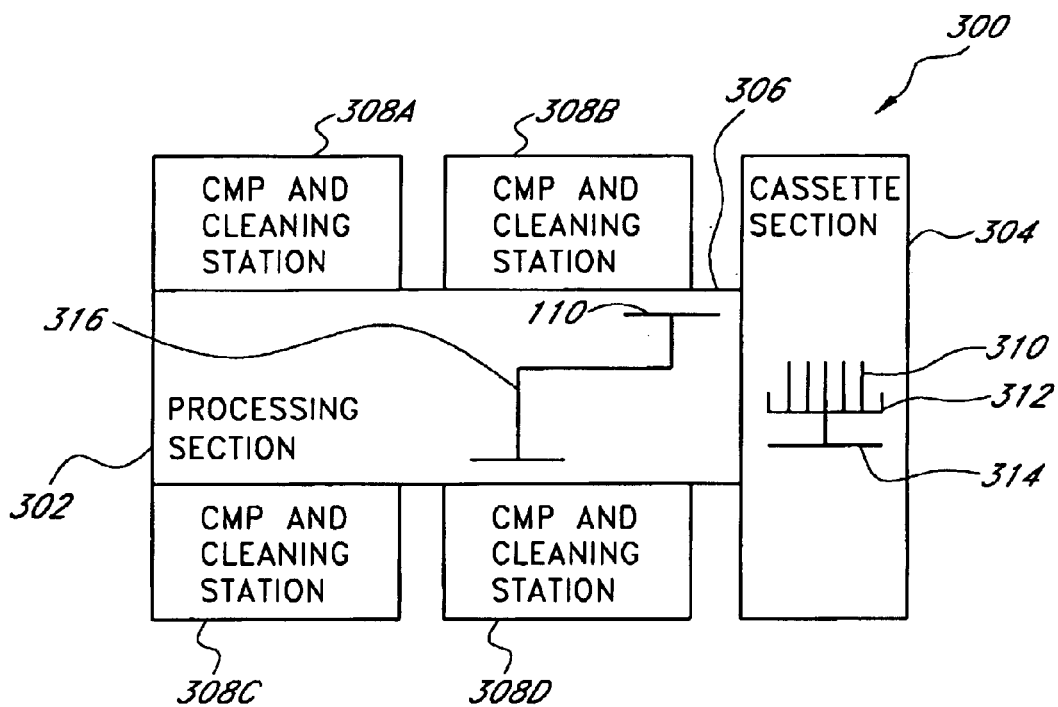
FIG. 3 illustrates a third embodiment of the present invention using a plurality of chemical mechanical processing process stations.

In operation, wafers 210 or work pieces to be plated with a conductive material and/or have a previously deposited conductive material disposed thereon are picked up and delivered to the cassette section 204 in a cassette 212 and then each may be transferred to the buffer section 206 by a first robot 214. Each wafer 210 may then be transferred to one of the vertical chambers 208A–208D, in the processing section 202 by a second robot 216. As mentioned above, the vertical chambers 208A–208D can be either adapted to process 200 or 300 millimeter wafers. After the plating and/or removal and cleaning processes are complete, the above transport steps are performed in reverse order to remove each of the wafers 210 from the integrated tool 200. FIG. 3 illustrates another embodiment of an integrated tool 300 or system of the present invention which comprises a processing section 302 and a load/unload section 304 or a cassette section connected to the processing section through a buffer section 306. The processing section 302 may comprise one or more process stations 308A–308B which may be clustered around the processing section 302, as in the manner shown in FIG. 3. In this embodiment, the process stations 308A, 308D may preferably be vertically staked chambers which may have a chemical mechanical polishing (CMP) chamber and a cleaning chamber (i.e., CMP/cleaning chamber). If so configured, the integrated tool 300 of the present invention is able to process wafers with different diameters. In one example, the process stations 308A and 308B can process 300 mm wafers while the process stations 308C, 308D are processing 200 mm wafers or vice versa. As previously mentioned, one such exemplary vertical chamber design and operation is disclosed in the co-pending U.S. application Ser. No 09/466,014, entitled "Vertically Configured Chamber Used for Multiple Processes," filed Dec. 17, 1999, commonly owned by the assignee of the present invention.

Figure 4:
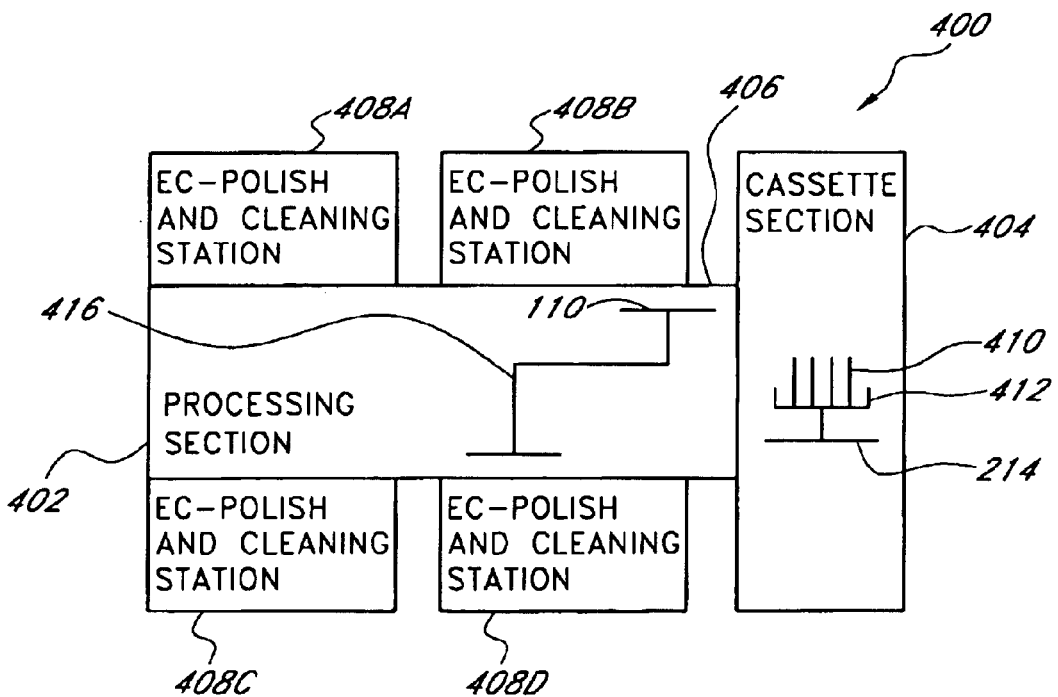
FIG. 4 illustrates a fourth embodiment of the present invention using a plurality of electro-chemical polishing or etching process stations.

In operation, wafers 310 or work pieces to be polished are delivered to the cassette section 304 in a cassette 312 and then each may be picked up transferred to the buffer section 306 by a first robot 314. Each wafer 310 may then be picked up and transferred to one of the vertical chambers 308A–308D in the processing section 302 by a second robot 316. As mentioned above, the vertical chambers 308A–308D can be either adapted to process 200 or 300 millimeter wafers. After the chemical mechanical polishing and cleaning processes are complete, the above transport steps are performed in reverse order to remove each of the wafers 310 from the integrated tool 300. FIG. 4 illustrates another embodiment of an integrated tool 400 or system of the present invention which comprises a processing section 402 and a load/unload section 404 or a cassette section connected to the processing section through a buffer section 406. The processing section 402 may comprise one or more process stations 408A–408D which may be clustered around the processing section 402, as in the manner shown in FIG. 4. In this embodiment, the process stations 408A–408D may preferably be vertically stacked chambers which may have an electrochemical polishing or electrochemical etching chamber and a cleaning chamber (i.e., EC-polishing/cleaning chamber). If so configured, the integrated tool 400 of the present invention is able to process wafers with different diameters. In one example, the process stations 408A and 408B can process 300 mm wafers while the process stations 408C, 408D are processing 200 mm wafers or vice versa. As previously mentioned, one such exemplary vertical chamber design and operation is disclosed in co-pending U.S. application Ser. No. 09/466,014, entitled "Vertically Configured Chamber Used for Multiple Processes," filed Dec. 17, 1999, commonly owned by the assignee of the present invention.

In operation, wafers 410 or work pieces to be electrochemically polished are delivered to the cassette section 404 in a cassette 412 and then each may be transferred to the buffer section 406 by a first robot 414. Each wafer 410 may then be picked up and transferred to the vertical chambers 408A–408D in the processing section 402 by a second robot 416. As mentioned above, the vertical chambers 408A–408D can be either adapted to process 200 or 300 millimeter wafers. After the EC polishing and cleaning processes are complete, the above transport steps are performed in reverse order to remove each of the wafers 410 from the integrated tool 400.

While it is apparent from the above discussions that an advantage of the present invention is reducing contaminants as well as the time consumed, since the number of operations that can take place within the same vertical chamber therefore do not require the robots to handle the wafers as much, when vertical chambers which have different processing capabilities are made part of the integrated system, even further advantages are obtained in terms of overall throughput and reduced contamination. This is because within each of the different plating and removal chambers that are associated with a single processing section, there is also associated a cleaning chamber. Accordingly, the amount of time that would otherwise be needed to transfer wafers from one processing chamber, to a different cleaning chamber, and then again to a different processing chamber are eliminated, as will become more apparent hereinafter.

Figure 5:
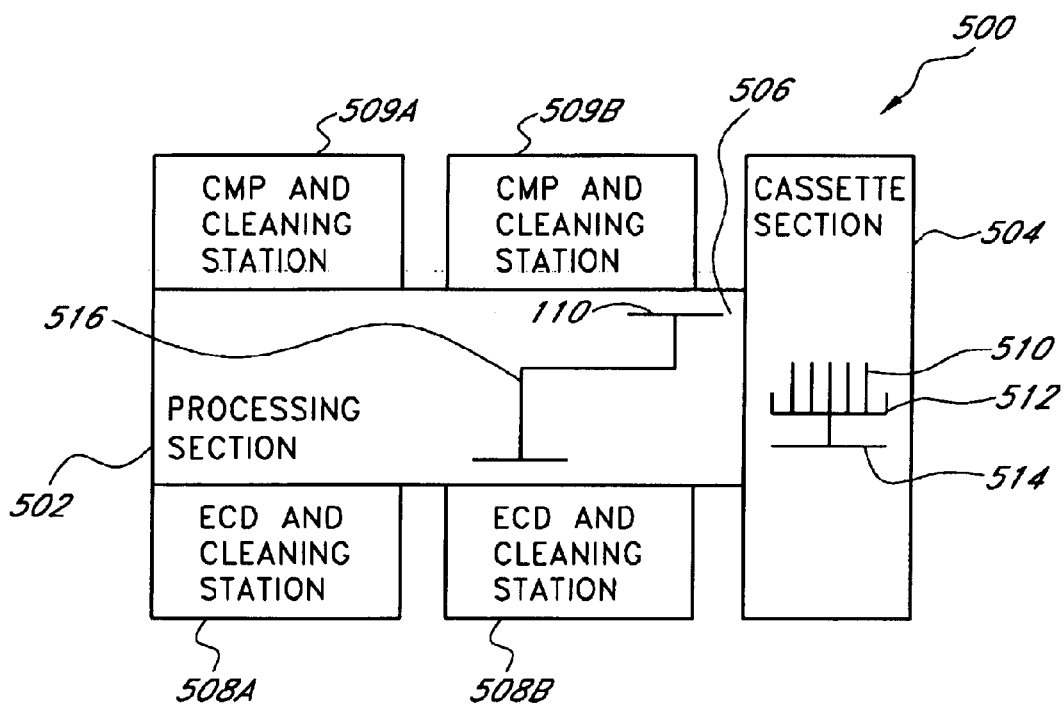
FIGS. 5 and 6 illustrate fifth and sixth embodiment of the present invention each using at least one plating process station and at least one conductor removal station.

FIG. 5 illustrates another embodiment of an integrated tool 500 or system of the present invention which comprises a processing section 502 and a load/unload section 504 or a cassette section connected to the processing section through a buffer section 506. The processing section 502 may comprise one or more process stations 508A, 508B and 509A, 509B which may be clustered around the processing section 502, as in the manner shown in FIG. 5. In this embodiment, the process stations 508A, 508B and 509A, 509B may preferably be vertically stacked chambers. The vertically stacked chambers may be arranged as a set of ECD/cleaning chambers 508A, 508B and a set of CMP/cleaning chambers 509A, 509B. As previously mentioned, one such exemplary vertical chamber design and operation is disclosed in the co-pending U.S. application Ser. No. 09/466,014, entitled "Vertically Configured Chamber Used for Multiple Processes," filed Dec. 17, 1999, commonly owned by the assignee of the present invention.

In operation, wafers 510 or work pieces to be plated and polished are delivered to the cassette section 504 in a cassette 512 and then each may be transferred to the buffer section 506 by a first robot 514. Each wafer 510 may then be picked up and transferred to one of the vertical chambers 508A, 508B and 509A, 509B by a second robot 516. In one example, the second robot 516 may initially transfers the wafers 510 to ECD/cleaning chamber 508A. Once the plating by deposition and an initial cleaning is over, the second robot 516 picks up the wafers and transfers them to the CMP/cleaning chamber 509A. After the chemical mechanical polishing and cleaning processes performed within the CMP/cleaning chamber 509A are complete, the second robot 516 and then the first robot 514 consecutively handle each wafer 510 to replace the wafer in the cassette 512 of the integrated tool 500. As mentioned above, the vertical chambers 508A, 508B or 509A, 509B can be either adapted to process 200 or 300 millimeter wafers.

Figure 6:
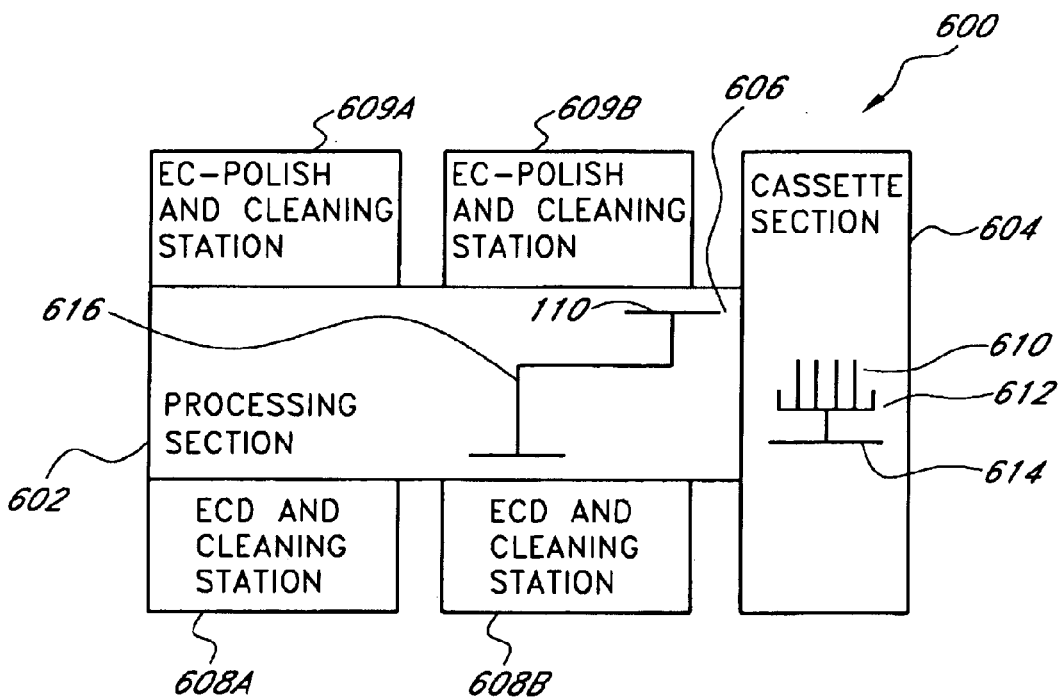

FIG. 6 illustrates another embodiment of an integrated tool 600 or system of the present invention which comprises a processing section 602 and a load/unload section 604 or a cassette section connected to the processing section through a buffer section 606. The processing section 602 may comprise one or more process stations 608A, 608B and 609A, 609B which may be clustered around the processing section 602, as in the manner shown in FIG. 6. In this embodiment, the process stations 608A, 608B and 609A, 609B may preferably be vertically stacked chambers. The vertically stacked chambers may be arranged as a set of ECD/cleaning chambers 608A, 608B and a set of EC-polishing/cleaning chambers 609A, 609B. As previously mentioned, one such exemplary vertical chamber design and operation is disclosed in the co-pending U.S. application Ser. No. 09/466,014, entitled "Vertically Configured Chamber Used for Multiple Processes," filed Dec. 17, 1999, commonly owned by the assignee of the present invention.

In operation, wafers 610 or work pieces to be plated and electrochemically polished and/or etched are delivered to the cassette section 604 in a cassette 612 and then each may be transferred to the buffer section 606 by a first robot 614. Each wafer 610 may then be picked up and transferred to one of the vertical chambers 608A, 608B and 609A, 609B by a second robot 616. In one example, the second robot 616 may initially transfer each of the wafers 610 to ECD/cleaning chamber 608A. Once the plating and subsequent initial cleaning take place within the ECD/cleaning chamber 608A, the second robot 616 picks up each of the wafer 610 and transfers it to the EC-polishing/cleaning chamber 609A. After the EC-polishing and cleaning processes performed within the EC-polishing/cleaning chamber 609A are complete, the second robot 516 and then the first robot 514 consecutively handle each wafer 610 to replace the wafer in the cassette 612 of the integrated tool 600. As mentioned above, the vertical chambers 608A, 608B or 609A, 609B can be either adapted to process 200 or 300 millimeter wafers.

Figure 7:
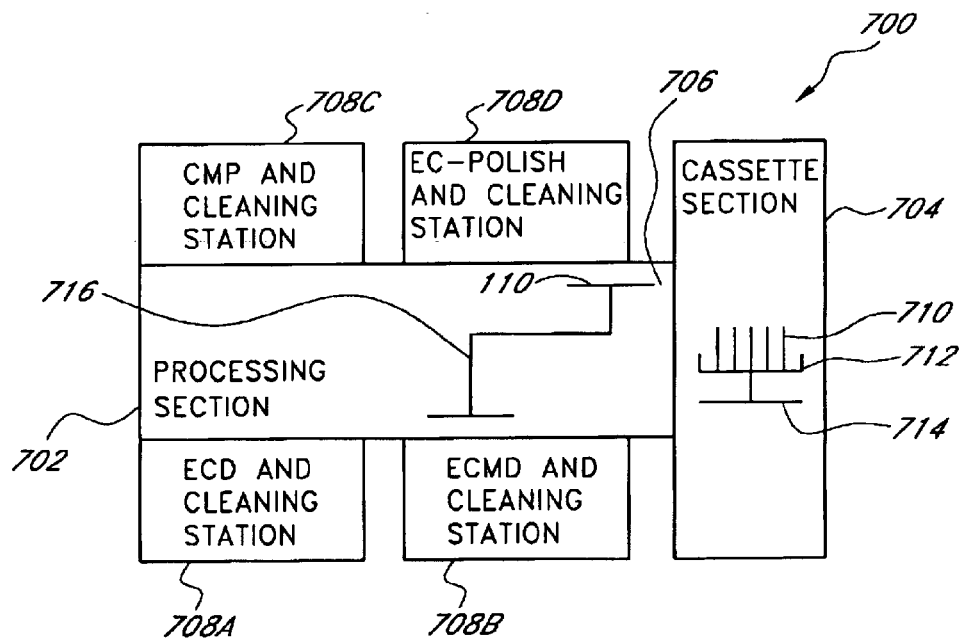
FIG. 7 illustrates a seventh embodiment of the present invention using a plurality of different process stations.

FIG. 7 illustrates another embodiment of an integrated tool 700 or system of the present invention which comprises a processing section 702 and a load/unload section 704 or a cassette section connected to the processing section through a buffer section 706. The processing section 702 may comprise a first, second, third and fourth process station 708A, 708B, 708C and 708D which may be clustered around the processing section 702, as in the manner shown in FIG. 7. In this embodiment, the process stations 708A–708D may preferably be vertically stacked chambers. The first station 708A may be comprised of an ECD/cleaning vertical chamber. The second station 708B may be comprised of an ECMD/cleaning vertical chamber. The third station 708C may be comprised of a CMP/cleaning vertical chamber. The fourth chamber 708D may be comprised of an EC-polishing/cleaning vertical chamber. As previously mentioned, one such exemplary vertical chamber design and operation is disclosed in the co-pending U.S. application Ser. No. 09/466,014, entitled "Vertically Configured Chamber Used for Multiple Processes," filed Dec. 17, 1999, commonly owned by the assignee of this invention.

In operation, wafers 710 or work pieces to be plated (with ECD and/or ECMD) and electro-chemically polished or CMP polished are delivered to the cassette section 704 in a cassette 712 and then each may be transferred to the buffer section 706 by a first robot 714. Each wafer 710 may then be picked and transferred to one of the vertical chambers 708A–708D by a second robot 716.

In one example, the second robot 716 may initially transfer the wafer 710 to ECMD/cleaning chamber 708B. Once the plating and/or electropolishing, and then an initial cleaning is performed within the ECMD/cleaning chamber 708B the second robot 716 picks up the wafer 710 and transfers it to the CMP/cleaning chamber 708C or EC-polishing/cleaning chamber 708D. After either chemical mechanical polishing and cleaning, or EC-polishing and cleaning, performed by CMP/cleaning chamber 708C or EC-polishing/cleaning chamber 708D, respectively, is complete, are complete, the second robot 716 and then the first robot 714 consecutively handle each wafer 710 to replace the wafer in the cassette 712 of the integrated tool 700.

In a second example, the second robot 716 may initially transfer the wafer 710 to ECD/cleaning chamber 708A. Once the plating and initial cleaning is performed within the ECD/cleaning chamber 708A, the second robot 716 picks up the wafer 710 and transfers it to the CMP/cleaning chamber 708C or EC-polishing/cleaning chamber 708D. After the chemical mechanical polishing and cleaning or EC polishing and cleaning processes, performed by the CMP/cleaning chamber 708C or EC-polishing/cleaning chamber 708D, respectively are complete, the second robot 716 and then the first robot 714 consecutively handle each wafer 710 to replace the wafer in the cassette 712 the integrated tool 700.

As mentioned above, the vertical chambers 708A, 708B or 708C, 708D can be either adapted to process 200 or 300 millimeter wafers. Although the above embodiments exemplified with four process stations, it is understood that the use of more than four, for example six, process chambers is within the scope of this invention.

It is also within the scope of the present invention that the above systems may also comprise an annealing chamber to anneal the wafers. When an anneal chamber is included, it is preferable to have the anneal chamber located in proximity to the buffer area, and for the anneal chamber to include both a "hot" section capable of heating the wafer, and a "cool" section capable of cooling the wafer after annealing has been completed. Such an anneal chamber will typically have the ability to operate upon a single wafer at a time, and is well known. Thus, further description is not believed necessary. What is advantageous with respect to the present invention is the manner in which the anneal chamber is integrated with the other processing sections, in order to maximize efficiency and throughput.

Depending upon the construction of the system, it may be that only one of both of the robots can be constructed to place wafers into or take wafers out of the anneal chamber. If both robots can perform such operation, as described below, then if there are no further operations after annealing, as will be described hereinafter, the anneal chamber can act as a substitute buffer area.

Figure 8:
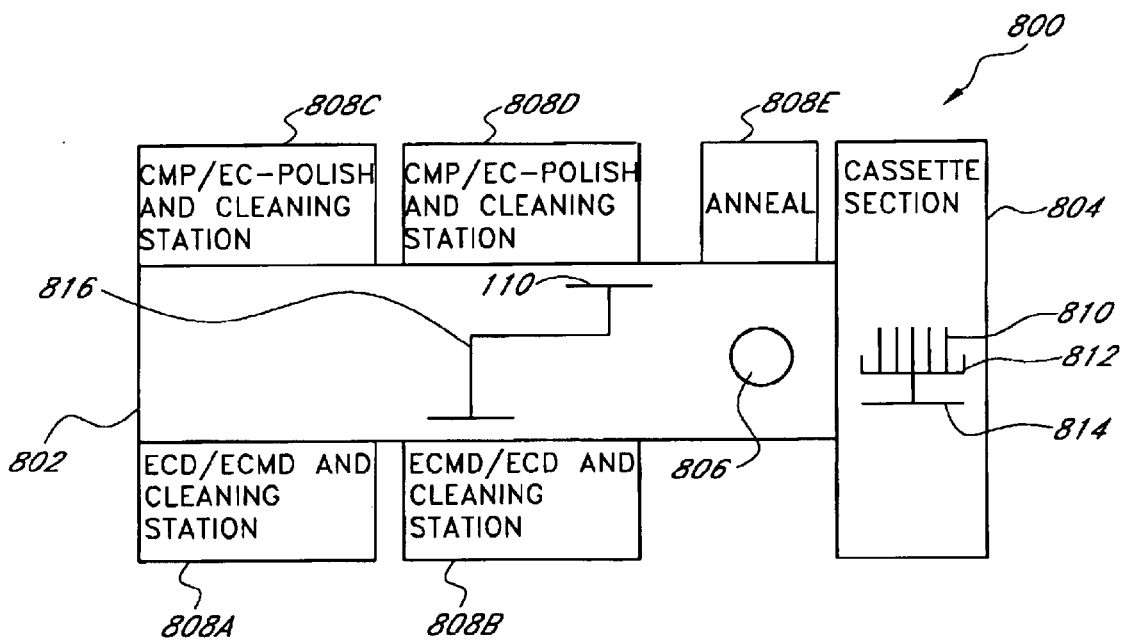
FIG. 8 illustrates an eighth embodiment of the present invention using a plurality of different process stations, including an anneal station.

FIG. 8 illustrates an embodiment of an integrated tool 800 or system of the present invention using an anneal chamber as described above which comprises a processing section 802 and a load/unload section 804 or a cassette section connected to the processing section through a buffer section 806. The processing section 802 may comprise a first, second, third, fourth and fifth process station 808A, 808B, 808C, 808D and 808E which may be clustered around the processing section 802, as in the manner shown in FIG. 8. The first station 808A may be comprised of an ECD/cleaning vertical chamber or an ECMD/cleaning vertical chamber (both may also be used in a larger system) capable of operating upon 200 mm wafers. The second station 808B may be comprised of an ECD/cleaning vertical chamber or an ECMD/cleaning vertical chamber (both may also be used in a larger system) capable of operating upon 300 mm wafers. The third station 808C may be comprised of a CMP/cleaning vertical chamber or an EC-polishing/cleaning vertical chamber (both may also be used in a larger system), capable of operating upon 200 mm wafers. The fourth station 808D may be comprised of a CMP/cleaning vertical chamber or an EC-polishing/cleaning vertical chamber (both may also be used in a larger system), capable of operating upon 300 mm wafers. As previously mentioned, one such exemplary vertical chamber design and operation is disclosed in co-pending U.S. application Ser. No. 09/466,014, entitled "Vertically Configured Chamber Used for Multiple Processes," filed Dec. 17, 1999, commonly owned by the assignee of this invention. The fifth chamber 808E may be comprised of an annealing chamber, as described above.

In operation, wafers 810 or work pieces to be plated (with ECD and/or ECMD) are delivered to the cassette section 804 in a cassette 812 and then each may be transferred to the buffer section 806 by a first robot 814. Each wafer 810 may then be picked up and transferred to one of the vertical chambers 808A–808E by a second robot 816.

In one example, the second robot 816 may initially transfer each wafer 810 to one of the ECMD/cleaning chambers 808A and 808B, depending upon the size of the wafer. Once the plating and/or removal of conductive material from the front surface of the wafer and an initial cleaning is performed within the ECMD/cleaning chamber 808A or 808B, the second robot 816 picks up the wafer 810 and transfers it to the annealing chamber 808E. Once annealed and chilled within the annealing chamber, the wafer 810 can then be picked up by the second robot 816 and transported to one of the CMP/cleaning chambers or EC-polishing/cleaning chambers 808C or 808D, depending upon the size of the wafer. Once conductive material is removed from the front face of the wafer using either the CMP/cleaning chamber or EC-polishing/cleaning chamber from 808C or 808D, and the subsequent cleaning within that same vertical chamber is completed, the second robot 816 and then first robot 814 can cooperate to transfer the wafer back to the cassette section 804. As another example, if after the anneal there is not need for further processing, the wafer can be picked up from the anneal chamber by the first robot 814 and transferred directly back to the cassette section 804.

In the various embodiments mentioned above, it has been noted that the present invention is capable of operating upon different sized wafers, which wafers are placed into a cassette section. The size of the wafer in each of the different cassette is known, such as through the use of a software tag that is used by a system controller. Further, the robot arms that lift the wafers are configured so that they can detect the center of each wafer, regardless of size, and properly pick the wafer up.

In addition, for each wafer, the system controller is also loaded with the process sequence, or recipe, that is needed for that wafer, with various portions of the process sequence performed by different processing stations. When sending a particular wafer to a particular processing station, that portion of the recipe can be sent in a command by the system controller to a processing station module, and that process can then take place, which then also allows tracking of the wafers that are being routed.

While in a production environment it is typical for each wafer to have the same process sequence, and that is contemplated by the present invention as well, in certain research settings, have more control over the processing of each wafer has been found beneficial. Thus, as each wafer is transported to the appropriate processing station, which can include processing stations of the same type which operate upon different sized wafers, the system controller will track the progress of the wafer through the system, so that coordination of the transport of the wafer from processing station to processing station can occur.

It should be understood, of course, that the foregoing relates to preferred embodiments of the invention and that modifications may be made without departing from the spirit and scope of the invention as set forth in the following claims.

We claim:

1. An integrated system for processing a plurality of wafers, wherein each wafer has a conductive front surface, the system comprising:
   a plurality of processing subsystems, wherein each processing subsystem comprises a process chamber for depositing on or removing from the conductive front surface of each wafer at least a portion of a conductive material and a cleaning chamber for removing residues that accumulate on the wafer during prior usage of the respective process chamber, wherein the process chamber and the cleaning chamber are vertically stacked; and
   a wafer handling subsystem for transporting the wafer into or out of the plurality of processing subsystems and into or out of a wafer holding system.

2. The system of claim 1, wherein the process chamber of each of the plurality of process subsystems is an electrochemical mechanical deposition chamber.

3. The system of claim 1, wherein the process chamber of each of the plurality of process subsystems is an electrochemical deposition chamber.

4. The system of claim 1, wherein the process chamber of each of the plurality of process subsystems is an chemical mechanical polishing chamber.

5. The system of claim 1, wherein the process chamber of each of the plurality of process subsystems is an electrochemical polishing chamber.

6. The system of claim 1, wherein each of the processing subsystems are disposed in a cluster arrangement adjacent the wafer-handling subsystem.

7. The system of claim 6, wherein the wafer-handling subsystem includes at least one wafer-handling robot.

8. The system according to claim 1, wherein the cleaning chamber in each of the processing subsystems removes the residue by performing cleaning using a fluid and drying.

9. The system according to claim 8 wherein the fluid is water.

10. The system according to claim 8, wherein each cleaning chamber in each of the processing subsystems removes a portion of the conductive material deposited near an edge of the wafer.

11. The system according to claim 10, wherein the wafer-handling subsystem only handles wafers that are dry.

12. The system according to claim 1, wherein the wafer-handling subsystem only handles wafers that are dry.

13. The system of claim 1, wherein:
   at least a certain one of the plurality of processing subsystems is capable of operating upon one size wafer and another one of the plurality of processing subsystems is capable of operating upon a different size wafer than the one size wafer.

14. The system of claim 13, wherein the process chamber of each of the plurality of processing subsystems is an electrochemical mechanical deposition chamber.

15. The system of claim 13, wherein the process chamber of each of the plurality of processing subsystems is an electrochemical deposition chamber.

16. The system of claim 13, wherein the process chamber of each of the plurality of processing subsystems is one of a chemical mechanical polishing chamber and an electrochemical polishing chamber.

17. An integrated system for processing a plurality of wafers, wherein each wafer has a conductive front surface, the system comprising:
   a plurality of processing subsystems, wherein each processing subsystem comprises a process chamber for depositing on or removing from the conductive front surface of each wafer at least a portion of a conductive material and a cleaning chamber disposed vertically with respect to the process chamber for removing residues that accumulate on the wafer during prior usage of the respective process chamber; and
   a wafer handling subsystem for transporting the wafer into or out of the plurality of processing subsystems and into or out of a wafer holding system, wherein the wafer-handling subsystem includes first and second wafer-handling robots,
   the first wafer handling robot configured to remove each wafer from a cassette, place the wafer in a buffer, and subsequently remove each wafer from the buffer and replace the wafer in the cassette; and
   the second wafer handling robot configured to remove each wafer from the buffer, place the wafer in one of the plurality of processing subsystems, and subsequently remove each wafer from the one processing subsystem and replace the wafer in the buffer.

18. The system according claim 17, wherein the wafer-handling subsystem only handles wafers that are dry.

19. The system of claim 18, wherein the process chamber of each of the plurality of processing subsystems is an electrochemical mechanical deposition chamber.

20. The system of claim 18, wherein the process chamber of each of the plurality of processing subsystems is an electrochemical deposition chamber.

21. The system of claim 18, wherein the process chamber of each of the plurality of processing subsystems is an chemical mechanical polishing chamber.

22. The system of claim 18, wherein the process chamber of each of the plurality of processing subsystems is an electrochemical polishing chamber.

23. The system of claim 17, wherein:
   at least a certain one of the plurality of processing subsystems is capable of operating upon one size wafer and another one of the plurality of processing subsystem is capable of operating upon a different size wafer than the one size wafer; and
   the first and second robots are each capable of handling the one and the different size wafer.

24. An integrated system for processing a plurality of wafers, wherein each wafer has a conductive front surface, the system comprising:
   a plurality of processing subsystems, wherein each processing subsystem comprises a process chamber for depositing on or removing from the conductive front surface of each wafer at least a portion of a conductive material and a cleaning chamber disposed within the processing subsystem for removing residues that accumulate on the wafer during prior usage of the respective process chamber, wherein the process chamber and the cleaning chamber are vertically stacked;

an anneal chamber capable of annealing at least one wafer; and a wafer handling subsystem for transporting the wafer into or out of the plurality of processing subsystems and into or out of a wafer holding system.

25. The system of claim 24, wherein the process chamber of each of the plurality of processing subsystems is an electrochemical mechanical deposition chamber.

26. The system of claim 24, wherein the process chamber of each of the plurality of processing subsystems is an electrochemical deposition chamber.

27. The system of claim 24, wherein the process chamber of each of the plurality of processing subsystems is a chemical mechanical polishing chamber.

28. The system of claim 24, wherein the process chamber of each of the plurality of processing subsystems is an electrochemical polishing chamber.

29. The system of claim 24, wherein each of the processing subsystems are disposed in a cluster arrangement adjacent the wafer-handling subsystem.

30. The system of claim 29, wherein the wafer-handling subsystem includes at least one wafer-handling robot.

31. The system according to claim 24, wherein the cleaning chamber in each of the processing subsystems removes the residue by performing cleaning using a fluid and drying.

32. The system according to claim 31, wherein each cleaning chamber in each of the processing subsystems removes a portion of the conductive material deposited near an edge of the wafer.

33. The system according to claim 32, wherein the wafer-handling subsystem only according to the wafer-handling subsystem only handles wafers that are dry.

34. The system according to claim 24, wherein the wafer-handling subsystem only handles wafers that are dry.

35. An integrated system for processing a plurality of wafers, wherein each wafer has a conductive front surface, the system comprising:

a plurality of processing subsystems, wherein each processing subsystem comprises a process chamber for depositing on or removing from the conductive front surface of each wafer at least a portion of a conductive material and a cleaning chamber disposed within the processing subsystem for removing residues that accumulate on the wafer during prior usage of the respective process chamber;

an anneal chamber capable of annealing at least one wafer; and a wafer handling subsystem for transporting the wafer into or out of the plurality of processing subsystems and into or out of a wafer holding system, wherein the wafer-handling subsystem includes first and second wafer-handling robots, the first wafer handling robot configured to remove each wafer from a cassette, place the wafer in a buffer, and subsequently remove each wafer from the buffer or the anneal chamber and replace the wafer in the cassette; and the second wafer handling robot configured to remove each wafer from the buffer, place the wafer in one of the plurality of processing subsystems, and subsequently remove each wafer from the one processing subsystem and place the wafer in the buffer or the anneal chamber.

36. The system according to claim 35, wherein the wafer-handling subsystem only handles wafers that are dry.

37. The system of claim 36, wherein the process chamber of each of the plurality of processing subsystems is an electrochemical mechanical deposition chamber.

38. The system of claim 36, wherein the process chamber of each of the plurality of processing subsystems is an electrochemical deposition chamber.

39. The system of claim 36, wherein the process chamber of each of the plurality of processing subsystems is a chemical mechanical polishing chamber.

40. The system of claim 36, wherein the process chamber of each of the plurality of processing subsystems is an electrochemical polishing chamber.

* * * * *

UNITED STATES PATENT AND TRADEMARK OFFICE
CERTIFICATE OF CORRECTION

PATENT NO. : 6,953,392 B2
DATED : October 11, 2005
INVENTOR(S) : Ashjaee et al.

It is certified that error appears in the above-identified patent and that said Letters Patent is hereby corrected as shown below:

<u>Column 10,</u>
Line 34, after "according" insert -- to --.
Lines 51-52, delete "subsystem" and insert -- subsystems --.

<u>Column 11,</u>
Lines 31-32, after "subsystem only" delete "according to the wafer-handling subsystem only".

Signed and Sealed this

Ninth Day of May, 2006

JON W. DUDAS
*Director of the United States Patent and Trademark Office*